United States Patent
Park (10) Patent No.: US 12,408,227 B2
(45) Date of Patent: Sep. 2, 2025

(54) WIRELESS MICROPHONE SYSTEM COMPRISING WIRELESS MICROPHONE TRANSMITTER AND RECEIVER

(71) Applicant: Sang Rae Park, Seoul (KR)

(72) Inventor: Sang Rae Park, Seoul (KR)

(*) Notice: Subject to any disclaimer, the term of this patent is extended or adjusted under 35 U.S.C. 154(b) by 404 days.

(21) Appl. No.: 18/026,762

(22) PCT Filed: Jul. 21, 2021

(86) PCT No.: PCT/KR2021/009393
§ 371 (c)(1),
(2) Date: Mar. 16, 2023

(87) PCT Pub. No.: WO2022/059901
PCT Pub. Date: Mar. 24, 2022

(65) Prior Publication Data
US 2023/0345571 A1    Oct. 26, 2023

(30) Foreign Application Priority Data

Sep. 18, 2020   (KR) .......................... 10-2020-0120206

(51) Int. Cl.
*H04W 76/28*    (2018.01)
*H03M 1/00*     (2006.01)
*H04R 29/00*    (2006.01)
*H04W 52/02*    (2009.01)
*H04W 76/20*    (2018.01)

(52) U.S. Cl.
CPC .......... *H04W 76/20* (2018.02); *H03M 1/001* (2013.01)

(58) Field of Classification Search
CPC ...... H04B 10/50; H04B 10/2589; H04B 5/48; H04B 1/48; H04B 1/71635; H04J 14/0232; H04J 14/0235; H04R 2499/11; H04R 29/004; H04R 5/04
See application file for complete search history.

(56) References Cited

U.S. PATENT DOCUMENTS

| | | | |
|---|---|---|---|
| 11,102,814 B2* | 8/2021 | Bhorkar | H04L 5/005 |
| 2017/0339682 A1* | 11/2017 | Lee | H04L 1/188 |
| 2019/0058958 A1* | 2/2019 | Proctor, Jr. | H04N 21/4622 |
| 2020/0029276 A1* | 1/2020 | Kim | H04W 48/16 |
| 2020/0120607 A1* | 4/2020 | Kim | H04W 52/0235 |
| 2020/0260186 A1* | 8/2020 | Stachura | G10L 15/30 |
| 2022/0104260 A1* | 3/2022 | Wang | H04W 72/0446 |
| 2022/0346010 A1* | 10/2022 | Zhou | H04W 52/0229 |

FOREIGN PATENT DOCUMENTS

| | | |
|---|---|---|
| JP | 2012-124847 A | 6/2012 |
| KR | 10-2008-0013652 A | 2/2008 |
| KR | 10-1405331 B1 | 6/2014 |
| KR | 10-1492736 B1 | 2/2015 |
| KR | 10-1604678 B1 | 3/2016 |

OTHER PUBLICATIONS

International Search Report mailed Nov. 2, 2021, issued International Application No. PCT/KR2021/009393.

* cited by examiner

*Primary Examiner* — Sai Aung
(74) *Attorney, Agent, or Firm* — Stein IP, LLC (57) ABSTRACT

The present invention relates to a wireless microphone system with which a receiver user can transmit sound to a wireless microphone user and with which the sound of the receiver user can be recorded, without a separate communication means or recording means.

7 Claims, 10 Drawing Sheets

WIRELESS MICROPHONE SYSTEM COMPRISING WIRELESS MICROPHONE TRANSMITTER AND RECEIVER

CROSS-REFERENCE TO RELATED APPLICATIONS

This application is a national stage of International Application No. PCT/KR2021/009393, filed Jul. 21, 2021, which claims the benefit of Korean Application No. 10-2020-0120206, filed Sep. 18, 2020, in the Korean Intellectual Property Office, the disclosures of which are incorporated herein by reference.

TECHNICAL FIELD

The present invention relates to a wireless microphone system comprising a wireless microphone transmitter and a receiver.

BACKGROUND ART

A wireless microphone system used for performances, lectures, broadcasting, and the like is composed of a wireless microphone transmitter and a receiver. The wireless microphone transmitter transmits voice data input through a microphone to the receiver, and the receiver receives the voice data and records or output the voice data through a speaker.

However, according to an existing wireless microphone system, when a user (e.g., a photographer) of a receiver needs to transmit voice, such as coating, questions, comments, etc., to a user (e.g., a person to be photographed) of a wireless microphone, or needs to record the transmitted voice, a separate communication means or recording means has to be used (e.g., by being connected to a camera). Therefore, it is impossible for the photographer to transmit voice to the person to be photographed or to record the voice of the photographer without additional equipment, and thus additional equipment is required in order to do so, which increases broadcasting production costs and complicated equipment operation.

In addition, since the existing wireless microphone system has no choice but to configure wireless microphone transmitters and receivers in one-to-one or many-to-one correspondence, it is impossible to use the wireless microphone system in situations where multiple photographers need to photograph one person to be photographed or multiple photographers need to photograph multiple persons to be photographed.

DETAILED DESCRIPTION OF THE INVENTION

Technical Problems

The present invention aims to provide a wireless microphone system with which a receiver user can transmit sound to a wireless microphone user and with which the sound of the receiver user can be recorded, without a separate communication means or recording means.

Further, the present invention aims to provide a wireless microphone system that can be utilized even in a situation where multiple photographers photograph one person to be photographed or several photographers photograph several persons to be photographed.

Technical Solution

In order to solve the aforementioned technical problems, a wireless microphone system according to the present invention includes a wireless microphone transmitter and a receiver, wherein the wireless microphone transmitter is configured to operate in one of a first mode for transmitting first data, which is input through an audio input unit of the wireless microphone transmitter, to the receiver and a second mode for receiving second data from the receiver, the receiver is configured to operate in one of a third mode for receiving the first data from the wireless microphone transmitter and a fourth mode for transmitting the second data, which is input through an audio input unit of the receiver, to the wireless microphone transmitter, the wireless microphone transmitter transmits the first data in a data transmission period when operating in the first mode in a time structure in which the data transmission period and a reception waiting period are alternately repeated, the receiver receives the first data in the data transmission period when operating in the third mode, transmits a first mode switch request message to the wireless microphone transmitter in the reception waiting period, switches to the fourth mode, and operates upon receiving a mode switch command in the third mode, and transmits the second data in the data transmission period when operating in the fourth mode, the wireless microphone transmitter switches to the second mode and operates upon receiving the first mode switch request message and receives the second data in the data transmission period when operating in the second mode, the receiver transmits a second mode switch request message to the wireless microphone transmitter in the reception waiting period, switches to the third mode, and operates upon receiving a mode switch command in the fourth mode, and the wireless microphone transmitter switches to the first mode and operates upon receiving the second mode switch request message.

The receiver may be provided with a mode switch button for receiving the mode switch command in the third mode and the mode switch command in the fourth mode from a user.

The wireless microphone transmitter may operate in the first mode by default and the receiver may operate in the third mode by default.

The wireless microphone transmitter may include an antenna; an audio input unit configured to receive an audio signal; an analog-to-digital (AD) converter configured to convert the audio signal into a digital signal and output the digital signal as the first data; a digital-to-analog (DA) converter configured to convert the second data into an analog signal and output the analog signal; an audio output unit configured to output a signal from the DA converter as an audio signal; and a control unit configured to transmit the first data through the antenna in the data transmission period in the first mode, receive the second data through the antenna in the data transmission period in the second mode, receive the first mode switch request message or the second mode switch request message in the reception waiting period, control switching from the first mode to the second mode in response to the first mode switch request message, and control switching from the second mode to the first mode in response to the second mode switch request message.

The receiver may include an antenna; an audio input unit configured to receive an audio signal; an AD converter configured to convert the audio signal into a digital signal and output the digital signal as the second data; a DA converter configured to convert the first data into an analog signal and output the analog signal; an audio output unit configured to output a signal from the DA converter as an audio signal; a mode switch button configured to receive the mode switch command in the third mode and the mode switch command in the fourth mode; and a control unit configured to transmit the first data through the antenna in the data transmission period in the third mode, receive the second data through the antenna in the data transmission period in the fourth mode, transmit the first mode switch request message through the antenna in the reception waiting period upon receiving the mode switch command in the third mode, transmit the second mode switch request message through the antenna in the reception waiting period upon receiving the mode switch command in the fourth mode, control switching to the fourth mode in response to the mode switch command in the third mode, and control switching to the third mode in response to the mode switch command in the fourth mode.

When a plurality of receivers are provided and any one of the receivers transmits the first mode switch request message in the reception waiting period, switches to the fourth mode, and transmits the second data in the data transmission period, the remaining receivers that have received the first mode request message may receive the second data in the data transmission period.

When a plurality of wireless microphone transmitters are provided, a plurality of receivers are provided, and any one of the receivers transmits the first mode switch request message in the reception waiting period, switches to the fourth mode, and transmits the second data in the data transmission period, the plurality of wireless microphone transmitters that have received the first mode switch request message may switch to the second mode and operate and the remaining receivers that have received the first mode switch request message may receive the second data in the data transmission period.

Advantageous Effects

The present invention described above may provide a wireless microphone system with which a receiver user can transmit sound to a wireless microphone user and with which the sound of the receiver user can be recorded, without a separate communication means or recording means.

The present invention described above may provide a wireless microphone system that can be used even in a situation where multiple photographers photograph one person to be photographed or multiple photographers photograph several persons to be photographed.

MODE FOR INVENTION

Hereinafter, preferred embodiments of the present invention will be described in detail with reference to the accompanying drawings. Like reference numerals hereinafter refer to the like elements in descriptions and the accompanying drawings and thus the repetitive description thereof will be omitted. Further, in describing the present invention, detailed descriptions related to publicly known functions or configurations will be omitted in order not to obscure the gist of the present invention.

Figure 1:
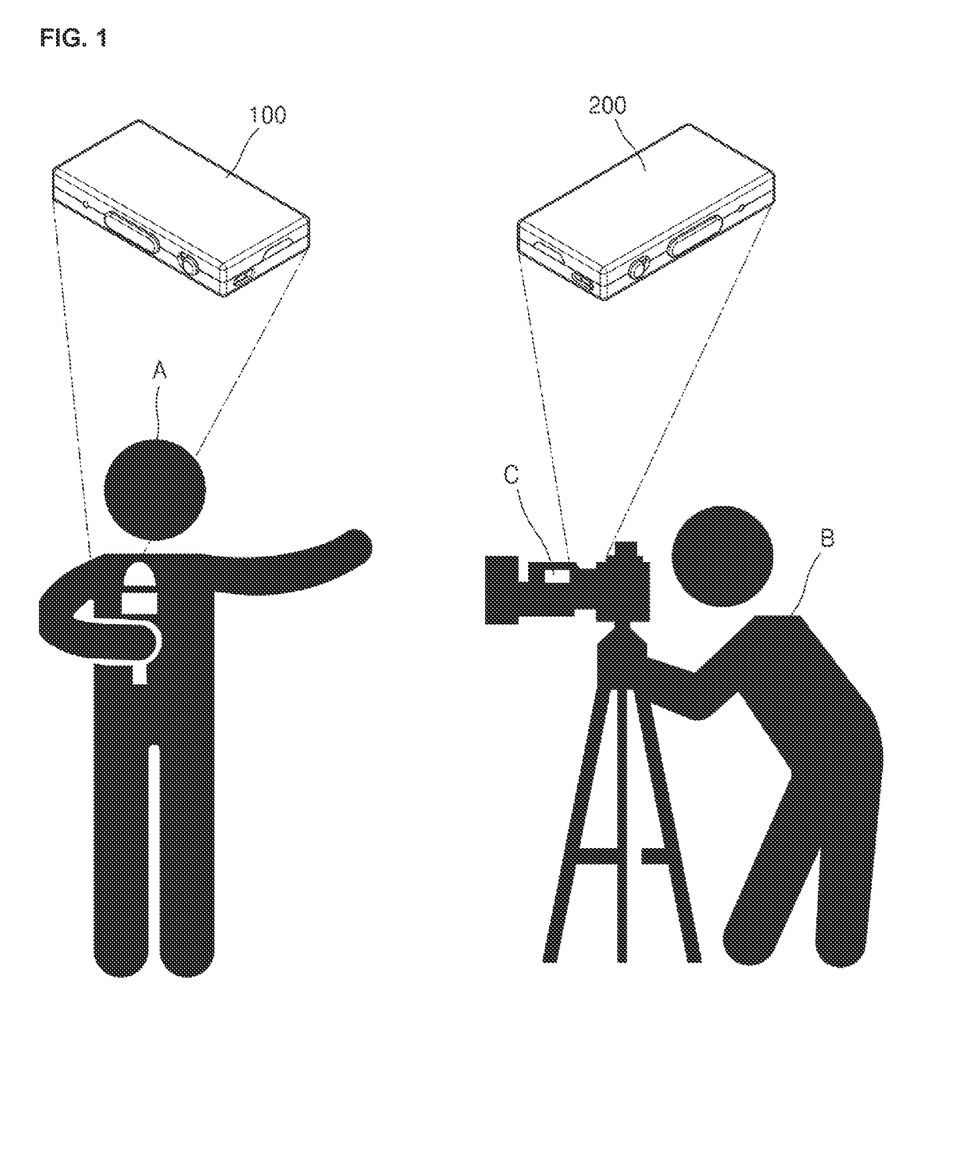
FIG. 1 illustrates the configuration of a wireless microphone system according to an embodiment of the present invention.

FIG. 1 illustrates the configuration of a wireless microphone system according to an embodiment of the present invention. A wireless microphone system according to the present embodiment includes a wireless microphone transmitter 100 and a receiver 200. When a photographer B photographs a person B to be photographed with a camera C, the person A may carry the wireless microphone transmitter 100 and the receiver 200 may be mounted on the camera C.

The wireless microphone transmitter 100 may be provided with an audio input unit and an audio output unit. The audio input unit may be a built-in microphone or an input terminal of an external microphone. The audio output unit may be a built-in speaker or an input terminal of an external speaker (or earphones).

The receiver 200 may be provided with an audio input unit and an audio output unit. The audio input unit may be a built-in microphone or an input terminal of an external microphone. The audio output unit may be a built-in speaker or an input terminal of an external speaker (or earphones). The audio output unit of the receiver 200 may be connected to the camera.

The wireless microphone transmitter 100 and the receiver 200 may directly exchange data between each other using wireless communication. For example, the wireless microphone transmitter 100 and the receiver 200 may exchange data through an unlicensed frequency band of 900 MHz.

Figure 2:
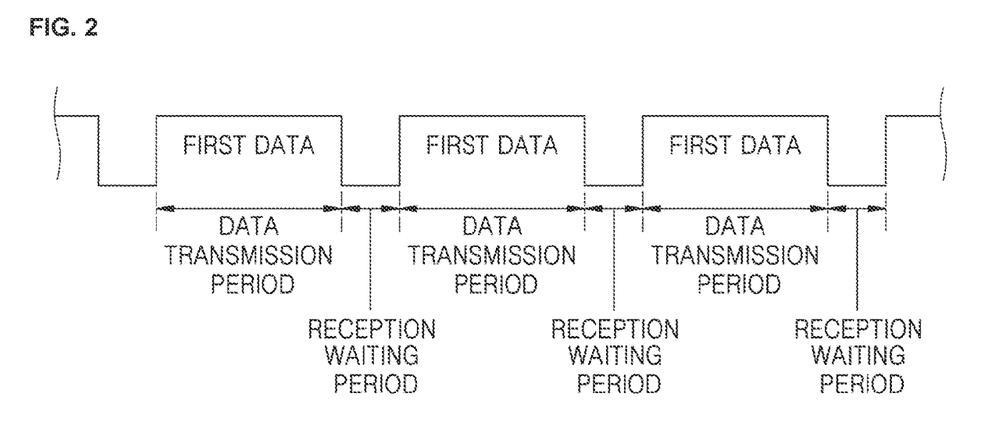
FIGS. 2 to 4 illustrate a time structure in which a wireless microphone transmitter 100 and a receiver 200 exchange data.
Figure 3:
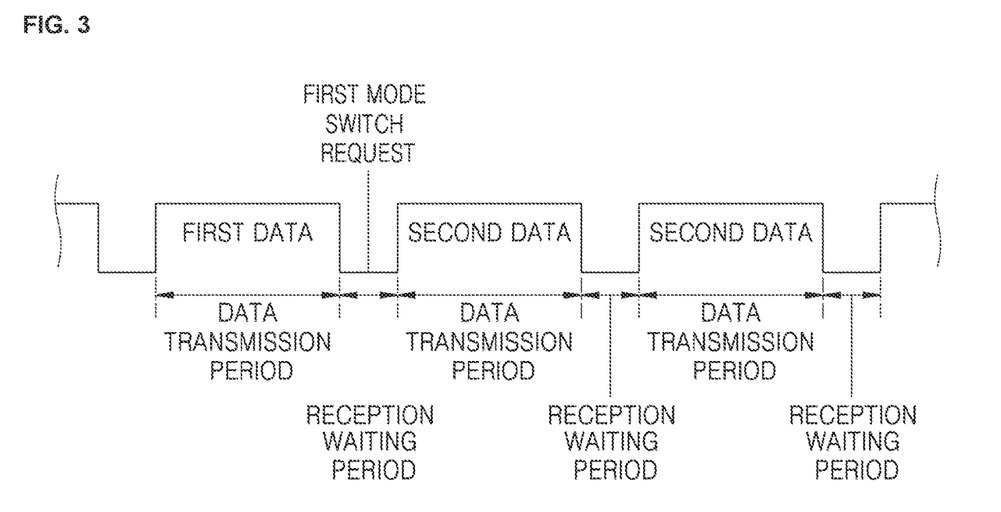
Figure 4:
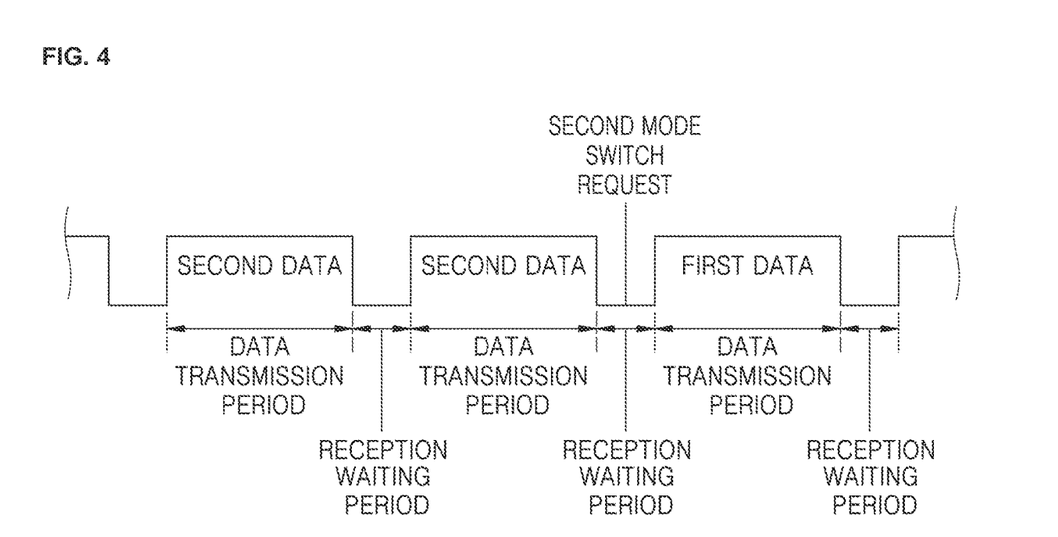

FIGS. 2 to 4 illustrate a time structure in which a wireless microphone transmitter 100 and a receiver 200 exchange data. The time structure is a structure in which a data transmission period during which the wireless microphone transmitter 100 and the receiver 200 transmit and receive voice data to and from each other and a reception waiting period during which voice data is not transmitted and received are alternately repeated. The time length of the data transmission period is longer than the time length of the reception waiting period.

The wireless microphone transmitter 100 is operable in one of a first mode for transmitting first data, which is input through its audio input unit, and a second mode for receiving second data from the receiver 200. The wireless microphone transmitter 100 may operate in the first mode by default (i.e., when the power is turned on).

The receiver 200 is operable in one of a third mode for receiving the first data from the wireless microphone transmitter 100 and a fourth mode for transmitting the second data, which is input through its audio input unit, to the wireless microphone transmitter 100. The receiver 200 may operate in the third mode by default (i.e., when the power is turned on).

Referring to FIG. 2 in conjunction with FIG. 1, the wireless microphone transmitter 100 transmits the first data to the receiver 200 in a data transmission period when operating in the first mode, and the receiver 200 receives the first data to the receiver 200 from the wireless microphone transmitter 100 in the data transmission period when operating in the third mode.

Referring to FIG. 3 in conjunction with FIG. 1, when the receiver 200 receives a mode switch command from a user (e.g., the photographer B) while operating in the third mode, the receiver 200 transmits a first mode switch request message to the wireless microphone transmitter 100 in a reception waiting period. Then, the receiver 200 switches to the fourth mode and operates. When operating in the fourth mode, the receiver 200 transmits the second data to the wireless microphone transmitter 100 in a data transmission period.

In response to receiving the first mode switch request message from the receiver 200, the wireless microphone transmitter 100 switches to the second mode and operates. When operating in the second mode, the wireless microphone transmitter 100 receives the second data from the receiver 200 in a data transmission period.

Referring to FIG. 4 in conjunction with FIG. 1, when the receiver 200 receives a mode switch command from a user (e.g., the photographer B) while operating in the fourth mode, the receiver 200 transmits a second mode switch request message to the wireless microphone transmitter 100 in a reception waiting period. Then, the receiver 200 switches back to the third mode and operates. That is, the receiver 200 receives the first data from the wireless microphone transmitter 100 in the data transmission period.

In response to receiving the second mode switch request message from the receiver 200, the wireless microphone transmitter 100 switches back to the first mode and operates. That is, the wireless microphone transmitter 100 transmits the first data to the receiver 200 in the data transmission period.

When the wireless microphone transmitter 100 operates in the first mode and the receiver 200 operates in the third mode, voice of the person A to be photographed or the surrounding sound of the person A may be transmitted from the wireless microphone transmitter 100 to the receiver 200 and output through the audio output unit of the receiver 200 or recorded in the camera C.

When the photographer B intends to transmit voice, such as coaching, questions, comments, etc., to the person A to be photographed or to record his/her own voice while the wireless microphone transmitter 100 is operating in the first mode and the receiver 200 is operating in the third mode, the photographer B inputs a mode switch command to the receiver 200. Then, the wireless microphone transmitter 100 may operate in the second mode and the receiver 200 may operate in the fourth mode so that the voice of the person A to be photographed is transmitted to the wireless microphone transmitter 100 from the receiver 200 and thereby output through the audio output unit of the wireless microphone transmitter 100 or recorded in the camera C.

When the photographer B intends to finish transmitting the voice, the photographer B inputs a mode switch command again to the receiver 200. Then, the wireless microphone transmitter 100 operates again in the first mode and the receiver 200 operates again in the third mode.

Figure 5:
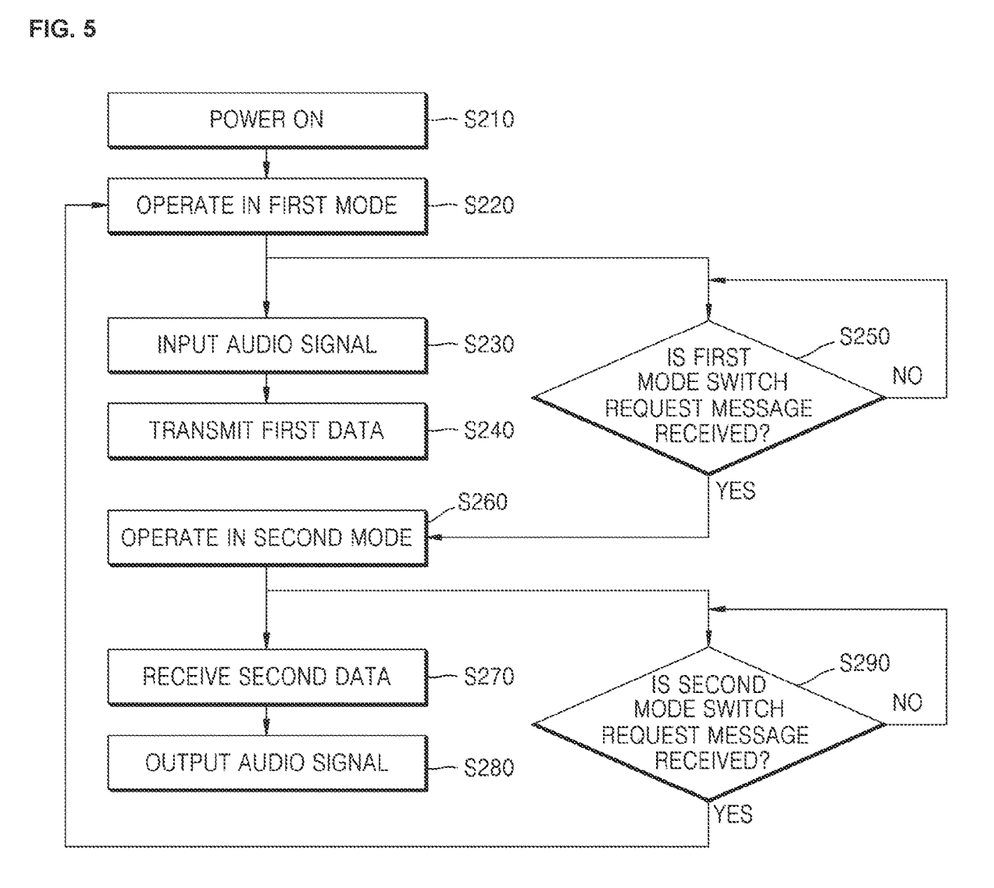
FIG. 5 is a flowchart illustrating an operation of the wireless microphone transmitter 100 according to an embodiment of the present invention.

FIG. 5 is a flowchart illustrating an operation of the wireless microphone transmitter 100 according to an embodiment of the present invention.

When the power of the wireless microphone transmitter 100 is turned on (S210), the wireless microphone transmitter 100 operates in the first mode by default (S220). In the first mode, the wireless microphone transmitter 100 receives an audio signal through the audio input unit (S230) and transmits first data that corresponds to the input audio signal to the receiver 200 in a data transmission period (S240).

When receiving a first mode switch request message while operating in the first mode (S250), the wireless microphone transmitter 100 switches to the second mode and operates (S260). In the second mode, the wireless microphone transmitter 100 receives second data from the receiver 200 in a data transmission period (S270) and outputs an audio signal that corresponds to the received second data through the audio output unit (S280).

When receiving a second mode switch request message while operating in the second mode (S290), the wireless microphone transmitter 100 operates again in the first mode (S220).

Figure 6:
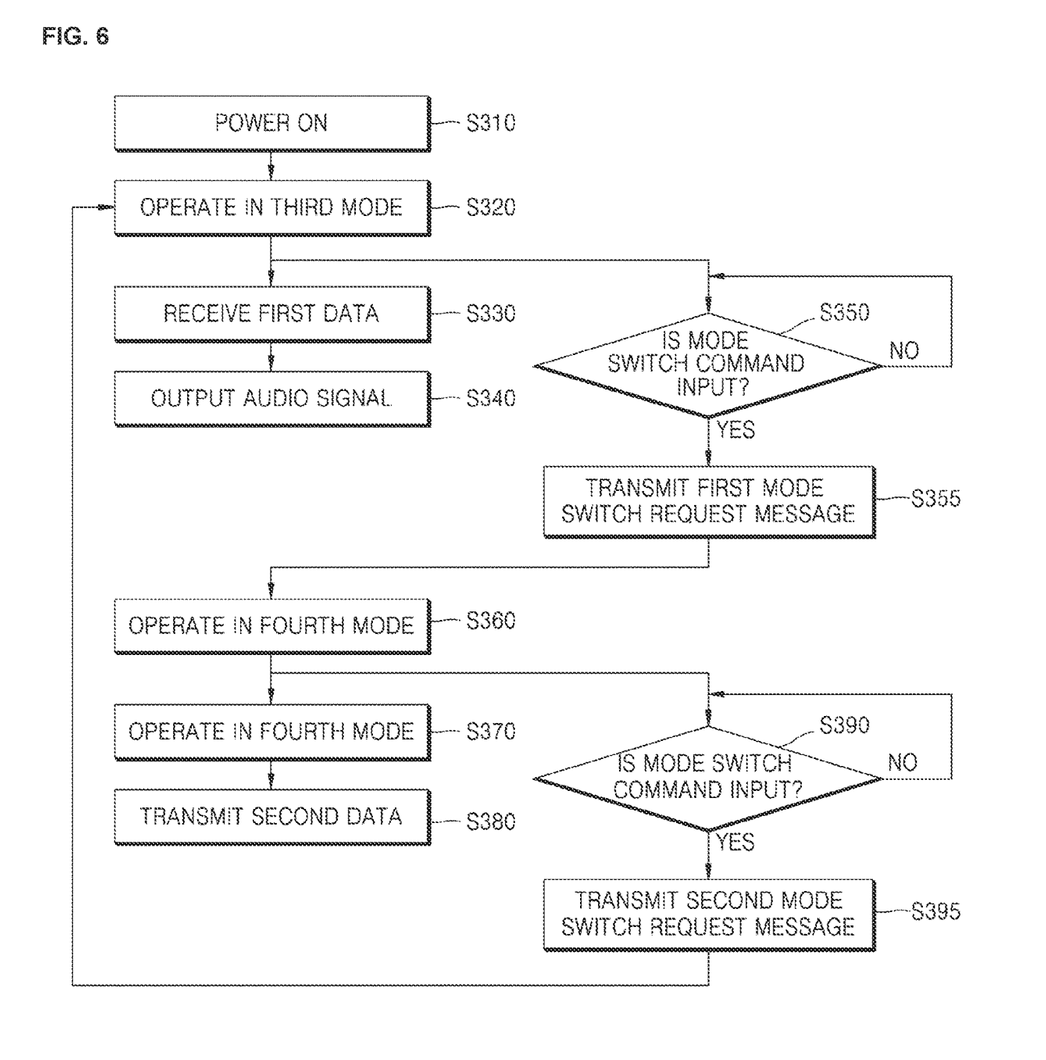
FIG. 6 is a flowchart illustrating an operation of the receiver 200 according to an embodiment of the present invention.

FIG. 6 is a flowchart illustrating an operation of the receiver 200 according to an embodiment of the present invention.

When the power of the receiver 200 is turned on (S310), the receiver 200 operates in the third mode by default (S320). In the third mode, the receiver 200 receives the first data from the wireless microphone transmitter 100 in a data transmission period (S330) and outputs an audio signal that corresponds to the received first data through the audio output unit (S340).

When receiving a mode switch command while operating in the third mode (S350), the receiver 200 transmits the first mode switch request message to the wireless microphone transmitter 100 in a reception waiting period (S355), switches to the fourth mode and operates (S360). In the fourth mode, the receiver 200 receives an audio signal through the audio input unit (S370) and transmits the second data that corresponds to the input audio signal to the wireless microphone transmitter 100 in a data transmission period (S380).

When receiving a mode switch command while operating in the fourth mode (S390), the receiver 200 transmits the second mode switch request message to the wireless microphone transmitter 100 in a reception waiting period (S395) and operates again in the third mode (S320).

Figure 7:
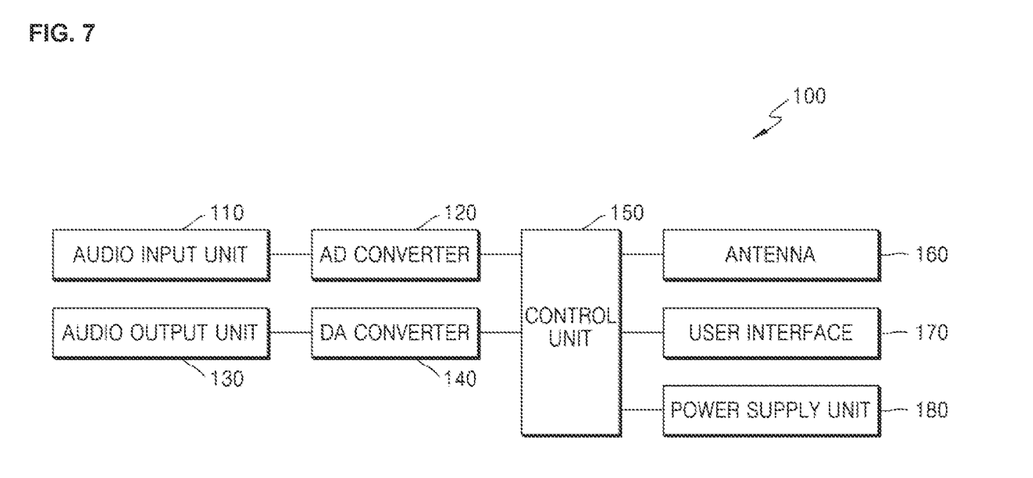
FIG. 7 illustrates a configuration of the wireless microphone transmitter 100 according to an embodiment of the present invention.

FIG. 7 illustrates a configuration of the wireless microphone transmitter 100 according to an embodiment of the present invention.

The wireless microphone transmitter 100 may include an audio input unit 110, an analog-to-digital (AD) converter 120, an audio output unit 130, a digital-to-analog (DA) converter 140, a control unit 150, an antenna 160, a user interface 170, and a power supply unit 180.

The audio input unit 110 receives an audio signal. The audio input unit 110 may be a built-in microphone or an input terminal of an external microphone.

The AD converter 120 converts the input audio signal into a digital signal and outputs the digital signal as first data.

The DA converter 140 converts second data from the control unit 150 into an analog signal and outputs the analog signal.

The audio output unit 130 outputs a signal from the DA converter 140 as an audio signal. The audio output unit 130 may be a built-in speaker or an input terminal of an external speaker (or earphones).

The antenna 160 transmits and receives data to and from the receiver 200.

In the first mode, the control unit 150 transmits the first data from the AD converter 120 through the antenna 160 in a data transmission period. In the second mode, the control unit 150 receives the second data from the receiver 200 through the antenna 160 in the data transmission period and provides the second data to the DA converter 140. The control unit 150 receives a first mode switch request message or a second mode switch request message from the receiver 200 in a reception waiting period. The control unit 150 controls switching from the first mode to the second mode in response to the first mode switch request message, and controls switching from the second mode to the first mode in response to the second mode switch request message.

The user interface 170 provides buttons for power on/off, volume control, etc., and displays an operating state.

The power supply unit 180 provides power for the operation of the wireless microphone transmitter 100.

Figure 8:
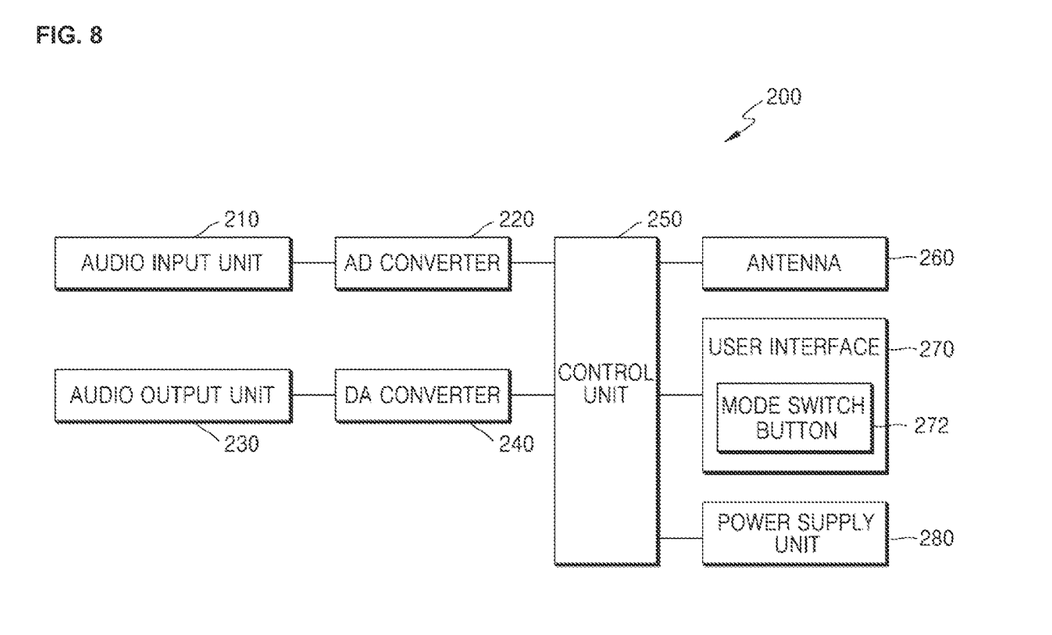
FIG. 8 illustrates a configuration of the receiver 200 according to an embodiment of the present invention.

FIG. 8 illustrates a configuration of the receiver 200 according to an embodiment of the present invention.

The receiver 200 may include an audio input unit 210, an AD converter 220, an audio output unit 230, a DA converter 240, a controller 250, an antenna 260, a user interface 270, and a power supply unit 280.

The audio input unit 210 receives an audio signal. The audio input unit 210 may be a built-in microphone or an input terminal of an external microphone.

The AD converter 220 converts the input audio signal into a digital signal and outputs the digital signal as second data.

The DA converter 240 converts first data from the control unit 250 into an analog signal and outputs the analog signal.

The audio output unit 230 outputs a signal from the DA converter 240 as an audio signal. The audio output unit 230 may be a built-in speaker or an input terminal of an external speaker (or earphones).

The antenna 260 transmits and receives data to and from the wireless microphone transmitter 100.

In the third mode, the control unit 250 receives the first data from the wireless microphone transmitter 100 through the antenna 260 in a data transmission period and provides the first data to the DA converter 240. In the fourth mode, the control unit 250 transmits the second data from the AD converter 220 through the antenna 260 in the data transmission period. Upon receiving a mode switch command in the third mode, the control unit 250 transmits a first mode switch request message through the antenna 260 in a reception waiting period, and upon receiving a mode switch command in the fourth mode, the control unit 250 transmits a second mode switch request message through the antenna 260 in the reception waiting period. The control unit 250 controls switching from the third mode to the fourth mode in response to the mode switch command in the third mode, and controls switching to the third mode in response to the mode switch command in the fourth mode.

The user interface 270 provides buttons for power on/off, volume control, etc., and displays an operating state. The user interface 270 includes a mode switch button 272 for inputting a mode switch command from the user. The mode switch button 272 may be a toggle button or a push button. In the case of a toggle button, the mode may be switched (i.e., from the third mode to the fourth mode or from the fourth mode to the third mode) each time the button is pressed. In the case of a push button, the receiver 200 operates in the third mode when the button is not pressed, and operates in the fourth mode while the button is pressed.

The power supply unit 280 provides power for the operation of the receiver 200.

In some embodiments, the wireless microphone transmitter 100 and the receiver 200 may be implemented in a single device, which may be selectively operable as one of the wireless microphone transmitter 100 and the receiver 200 according to the user setting. In this case, the function of the control unit 150 and the function of the control unit 250 may be implemented in a single control unit, which may be selectively operable according to the user setting, and the function of the user interface 170 and the function of the user interface 270 may be implemented in a single user interface, which may be selectively operable according to the user setting.

Figure 9:
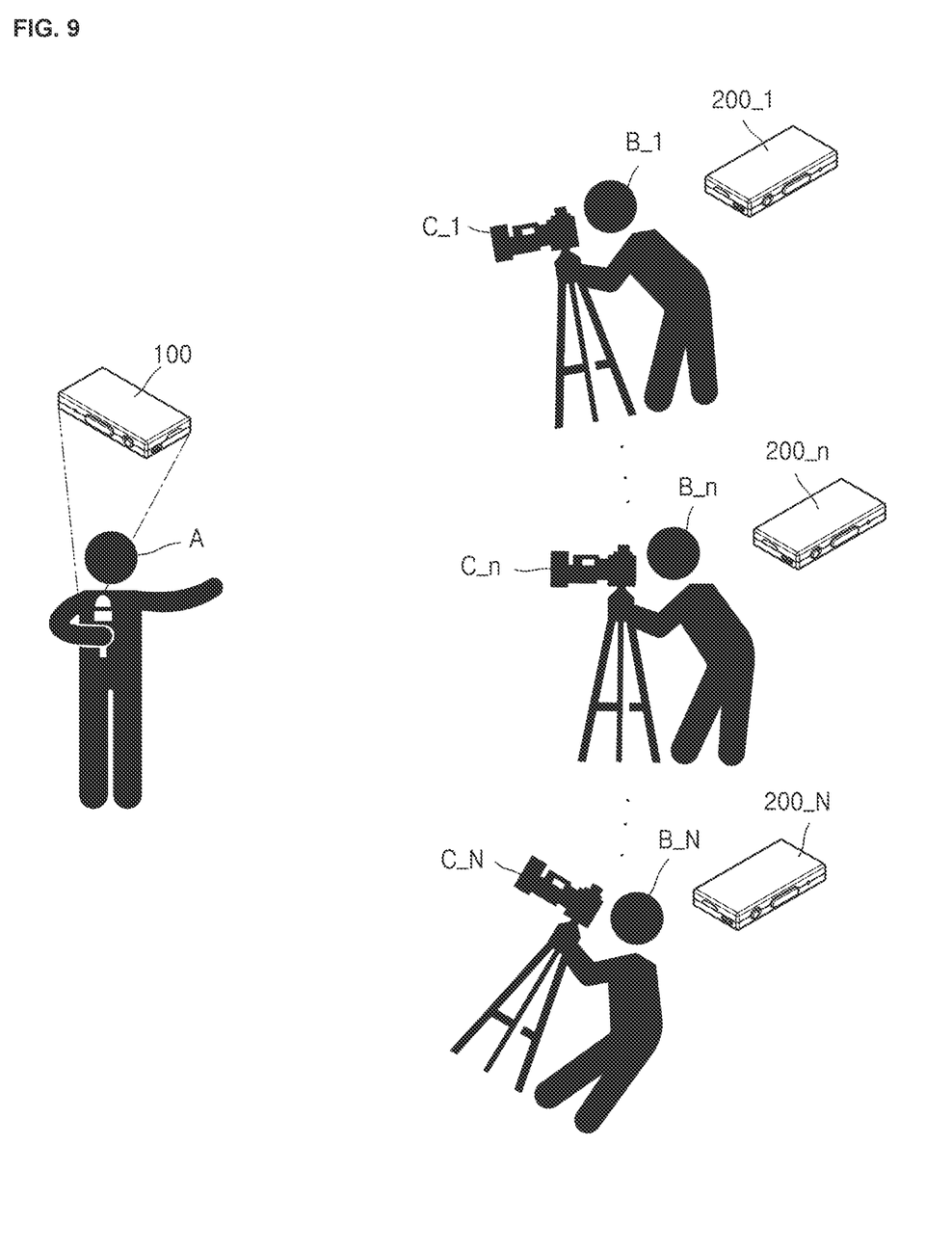
FIG. 9 illustrates a configuration of a wireless microphone system according to another embodiment of the present invention.

FIG. 9 illustrates a configuration of a wireless microphone system according to another embodiment of the present invention.

A wireless microphone system according to the present embodiment includes a wireless microphone transmitter 100 and a plurality of receivers 200_1, ..., 200_$n$, ..., and 200_N (where N is a natural number greater than or equal to 2 and n is a natural number (1≤n≤N)). The plurality of receivers 200_1, ..., 200_$n$, ..., and 200_N may be mounted in a plurality of cameras C_1, ..., C_$n$, ..., and C_N of a plurality of photographers B_1, ..., B_$n$, ..., and B_N, respectively.

When operating in a first mode, the wireless microphone transmitter 100 transmits first data to the plurality of receivers 200_1, ..., 200_$n$, ..., and 200_N in a data transmission period. When operating in a third mode, each of the receivers 200_1, ..., 200_$n$, ..., and 200_N receives the first data from the wireless microphone transmitter 100 in the data transmission period. Accordingly, the voice of a person A to be photographed can be transmitted to the plurality of photographers B_1, ..., B_$n$, ..., and B_N.

When any one receiver 200_$n$ of the plurality of receivers 200_1, ..., 200_$n$, ..., and 200_N receives a mode switch command from the photographer B_$n$ in the third mode, the receiver 200_$n$ transmits a first mode switch request message in a reception waiting period, switches to a fourth mode, and transmits second data in a data transmission period. The remaining receivers 200_1, ..., 200_$n$−1, 200_$n$+1, ..., and 200_N that have received the first mode switch request message receive the second data from the receiver 200_$n$ in the data transmission period. Accordingly, the voice of the photographer B_$n$ can be transmitted not only to the person A to be photographed but also to the other photographers B_1, ..., B_$n$−1, B_$n$+1, ..., and B_N.

Figure 10:
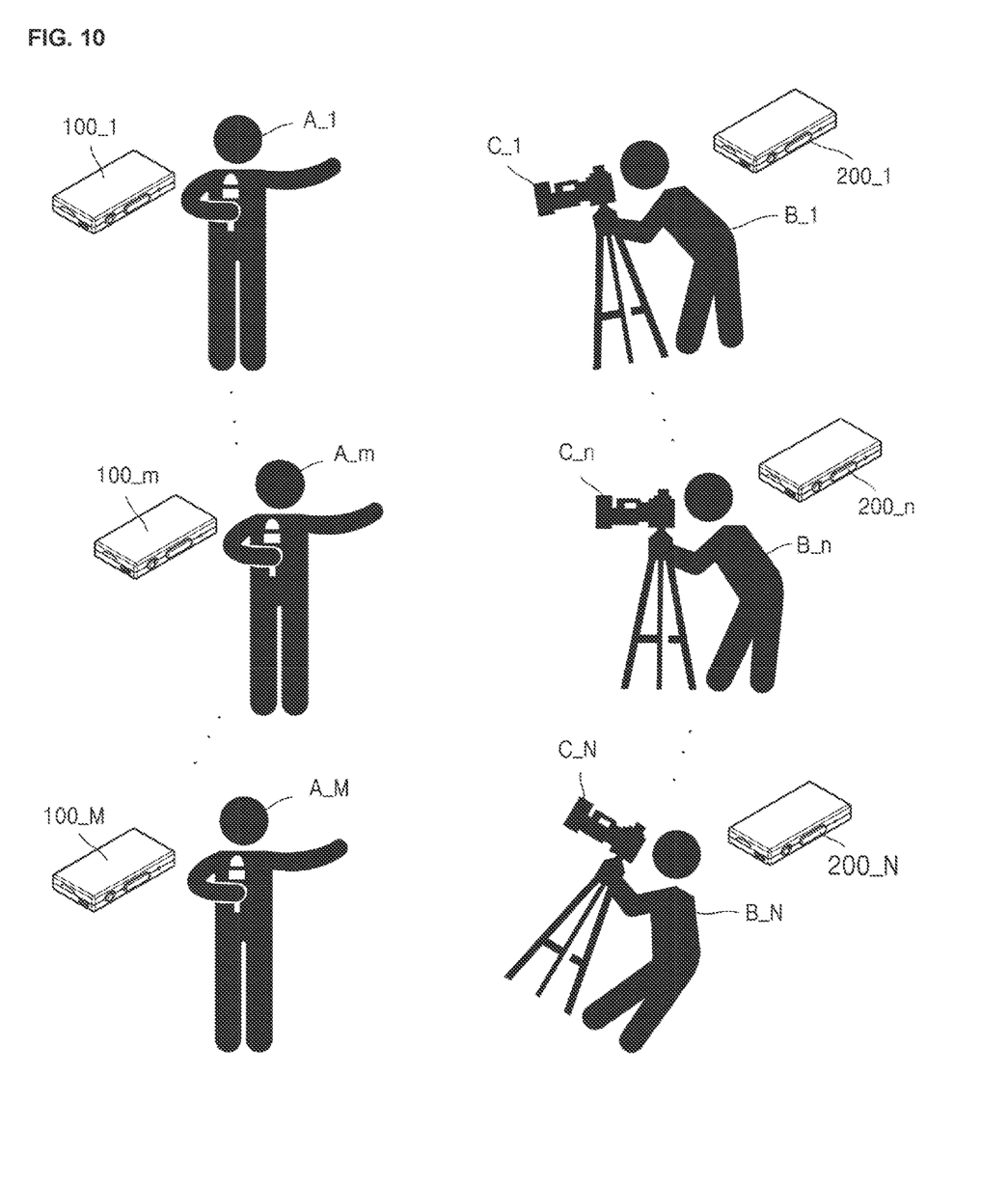
FIG. 10 illustrates a configuration of a wireless microphone system according to still another embodiment of the present invention.

FIG. 10 illustrates a configuration of a wireless microphone system according to still another embodiment of the present invention.

A wireless microphone system according to the present embodiment includes a plurality of wireless microphone transmitters 100_1, ..., 100_$m$, ..., and 100_M (where M is a natural number greater than or equal to 2 and m is a natural number (1≤m≤M)) and a plurality of receivers 200_1, ..., 200_$n$, ..., and 200_N (where N is a natural number greater than or equal to 2 and n is a natural number (1≤n≤N)). The plurality of wireless microphone transmitters 100_1, ..., 100_$m$, ..., and 100_M may be carried by a plurality of persons A_1, ..., A_$n$, ..., and A_M to be photographed, respectively, and the plurality of receivers 200_1, ..., 200_$n$, ..., and 200_N may be mounted in a plurality of cameras C_1, ..., C_n, ..., and C_N of a plurality of photographers B_1, ..., B_n, ..., and B_N, respectively.

When operating in a first mode, the plurality of wireless microphone transmitters 100_1, ..., 100_m, ..., and 100_M transmit first data to the plurality of receivers 200_1, ..., 200_n, ..., and 200_N, respectively, in a data transmission period. When operating in a third mode, the plurality of receivers 200_1, ..., 200_n, ..., and 200_N receive the first data from the plurality of wireless microphone transmitters 100_1, ..., 100_m, ..., and 100_M, respectively, in the data transmission period. Accordingly, the voice of the plurality of persons A_1, ..., A_n, ..., and A_M to be photographed can be transmitted to the plurality of photographers B_1, ..., B_n, ..., and B_N.

When any one receiver 200_n of the plurality of receivers 200_1, ..., 200_n, ..., and 200_N receives a mode switch command from the photographer B_n in the third mode, the receiver 200_n transmits a first mode switch request message in a reception waiting period, switches to a fourth mode, and transmits second data in a data transmission period. The plurality of wireless microphone transmitters 100_1, ..., 100_m, ..., and 100_M that have received the first mode switch request message switch to a second mode, and receive the second data from the receiver 200_n in the data transmission period. The remaining receivers 200_1, ..., 200_n−1, 200_n+1, ..., and 200_N that have received the first mode switch request message receive the second data from the receiver 200_n in the data transmission period. Accordingly, the voice of the photographer B_n can be transmitted to the plurality of persons A_1, ..., A_n, ..., and A_M to be photographed and the other photographers B_1, ..., B_n−1, B_n+1, ..., and B_N.

Meanwhile, one or more embodiments of the present invention can be written as computer programs and can be implemented in general-use digital computers that execute the programs using a computer readable recording medium. Examples of the computer readable recording medium include storage media such as magnetic storage media (e.g. ROM, floppy disks, hard disks, etc.) and optical recording media (e.g. CD-ROMs, or DVDs).

One or more embodiments of the present invention may be described in terms of functional block components and various processing steps. Such functional blocks may be realized by any number of hardware and/or software components configured to perform the specified functions. For example, one or more embodiments may employ various integrated circuit (IC) components, e.g., memory elements, processing elements, logic elements, look-up tables, and the like, which may carry out a variety of functions under the control of one or more microprocessors or other control devices. Similarly, where the elements are implemented using software programming or software elements, the embodiments may be implemented with any programming or scripting language such as C. C++, Java, assembler language, or the like, with the various algorithms being implemented with any combination of data structures, processes, routines or other programming elements. Functional aspects may be implemented in algorithms that are executed on one or more processors. Furthermore, one or more embodiments could employ any number of techniques according to the related art for electronics configuration, signal processing and/or control, data processing and the like. The words "mechanism," "element," "means," and "configuration" are used broadly and are not limited to mechanical or physical embodiments of the disclosure. The terms may include software routines in conjunction with processors, etc.

The particular implementations shown and described herein are illustrative examples of the inventive concept and are not intended to otherwise limit the scope of the disclosure in any way. For the sake of brevity, electronics, control systems, software development and other functional aspects of the systems according to the related art may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical apparatus. Moreover, no item or component is essential to the practice of the inventive concept unless the element is specifically described as "essential" or "critical."

Various embodiments are described with reference to the accompanying drawings. However, the scope of the disclosure is not intended to be limited to the particular embodiments, and it is to be understood that the disclosure covers various modifications, equivalents, and/or alternatives falling within the scope and spirit of the disclosure. Therefore, the above-described embodiments should be understood from an illustrative perspective, not from a restrictive perspective. The scope of the disclosure is apparent from the claims, rather than from the detailed description of the disclosure, and the meaning and scope of the claims and all modifications or variations derived from their equivalent concept should be interpreted as falling within the scope of the disclosure.

The invention claimed is:

1. A wireless microphone system comprising:
a wireless microphone transmitter; and
a receiver,
wherein:
the wireless microphone transmitter is configured to operate in one of a first mode for transmitting first data, which is input through an audio input unit of the wireless microphone transmitter, to the receiver and a second mode for receiving second data from the receiver,
the receiver is configured to operate in one of a third mode for receiving the first data from the wireless microphone transmitter and a fourth mode for transmitting the second data, which is input through an audio input unit of the receiver, to the wireless microphone transmitter,
the wireless microphone transmitter transmits the first data in a data transmission period when operating in the first mode in a time structure in which the data transmission period and a reception waiting period are alternately repeated,
the receiver receives the first data in the data transmission period when operating in the third mode, transmits a first mode switch request message to the wireless microphone transmitter in the reception waiting period, switches to the fourth mode, and operates upon receiving a mode switch command in the third mode, and transmits the second data in the data transmission period when operating in the fourth mode, the wireless microphone transmitter switches to the second mode and operates upon receiving the first mode switch request message and receives the second data in the data transmission period when operating in the second mode, the receiver transmits a second mode switch request message to the wireless microphone transmitter in the reception waiting period, switches to the third mode, and operates upon receiving a mode switch command in the fourth mode, and the wireless microphone transmitter switches to the first mode and operates upon receiving the second mode switch request message.

2. The wireless microphone system of claim 1, wherein the receiver is provided with a mode switch button for receiving the mode switch command in the third mode and the mode switch command in the fourth mode from a user.

3. The wireless microphone system of claim 1, wherein the wireless microphone transmitter is configured to operate in the first mode by default and the receiver is configured to operate in the third mode by default.

4. The wireless microphone system of claim 1, wherein the wireless microphone transmitter comprises:

an antenna;

an audio input unit configured to receive an audio signal;

an analog-to-digital (AD) converter configured to convert the audio signal into a digital signal and output the digital signal as the first data;

a digital-to-analog (DA) converter configured to convert the second data into an analog signal and output the analog signal;

an audio output unit configured to output a signal from the DA converter as an audio signal; and a control unit configured to transmit the first data through the antenna in the data transmission period in the first mode, receive the second data through the antenna in the data transmission period in the second mode, receive the first mode switch request message or the second mode switch request message in the reception waiting period, control switching from the first mode to the second mode in response to the first mode switch request message, and control switching from the second mode to the first mode in response to the second mode switch request message.

5. The wireless microphone system of claim 1, wherein the receiver comprises:

an antenna;

an audio input unit configured to receive an audio signal;

an AD converter configured to convert the audio signal into a digital signal and output the digital signal as the second data;

a DA converter configured to convert the first data into an analog signal and output the analog signal;

an audio output unit configured to output a signal from the DA converter as an audio signal;

a mode switch button configured to receive the mode switch command in the third mode and the mode switch command in the fourth mode; and a control unit configured to transmit the first data through the antenna in the data transmission period in the third mode, receive the second data through the antenna in the data transmission period in the fourth mode, transmit the first mode switch request message through the antenna in the reception waiting period upon receiving the mode switch command in the third mode, transmit the second mode switch request message through the antenna in the reception waiting period upon receiving the mode switch command in the fourth mode, control switching to the fourth mode in response to the mode switch command in the third mode, and control switching to the third mode in response to the mode switch command in the fourth mode.

6. The wireless microphone system of claim 1, wherein, when a plurality of receivers are provided and any one of the receivers transmits the first mode switch request message in the reception waiting period, switches to the fourth mode, and transmits the second data in the data transmission period, the remaining receivers that have received the first mode request message receives the second data in the data transmission period.

7. The wireless microphone system of claim 1, wherein, when a plurality of wireless microphone transmitters are provided, a plurality of receivers are provided, and any one of the receivers transmits the first mode switch request message in the reception waiting period, switches to the fourth mode, and transmits the second data in the data transmission period, the plurality of wireless microphone transmitters that have received the first mode switch request message switch to the second mode and operate and the remaining receivers that have received the first mode switch request message receive the second data in the data transmission period.

* * * * *